United States Patent [19]

Glock

[11] 4,415,995

[45] Nov. 15, 1983

[54] READ AMPLIFIER FOR A BIPOLAR MEMORY MODULE

[75] Inventor: Hans Glock, Höfa, Fed. Rep. of Germany

[73] Assignee: Siemens Aktiengesellschaft, Berlin & Munich, Fed. Rep. of Germany

[21] Appl. No.: 295,115

[22] Filed: Aug. 21, 1981

[30] Foreign Application Priority Data

Sep. 3, 1980 [DE] Fed. Rep. of Germany ....... 3033174

[51] Int. Cl.³ .............................................. G11C 7/00
[52] U.S. Cl. .................................. 365/190; 365/155; 307/530
[58] Field of Search ....................... 365/154, 155, 190; 307/279, 530

[56] References Cited

U.S. PATENT DOCUMENTS 3,919,566 11/1975 Millhollan et al. ................. 365/190

FOREIGN PATENT DOCUMENTS 1302313 1/1973 United Kingdom .

OTHER PUBLICATIONS

Beranger et al., "Read Circuit in a Memory Using Harper Cells", IBM Tech. Disc. Bul., vol. 21, No. 2, 7/78, pp. 642–643.

Primary Examiner—Stuart N. Hecker
Attorney, Agent, or Firm—Hill, Van Santen, Steadman & Simpson

[57] ABSTRACT

In a differential read amplifier of a bipolar memory module for the evaluation of a difference of read currents in a first and second bit line, an additional current generated by the read amplifier is fed into the bit line conducting the higher read current. As a result, a time period is reduced in which high interference susceptibility exists during successive read accesses to different memory cells with the same information content. Thus, read accesses can proceed in shorter time intervals.

6 Claims, 6 Drawing Figures

READ AMPLIFIER FOR A BIPOLAR MEMORY MODULE

BACKGROUND OF THE INVENTION

The invention relates to a read amplifier for a bipolar memory module formed of a plurality of memory cells arranged in matrix-fashion. The read amplifier evaluates a difference of higher and lower respective read currents in a first and a second bit line of the memory module.

A read amplifier of this type for utilization in rapid ECL memory modules is known from German Pat. No. 20 46 929, corresponding to British Pat. No. 1,302,313, incorporated herein by reference. For reasons which shall be presented in greater detail, particularly in the case of a change between two memory cells with the same information, there results, in comparison with the signal transit time $\tau$, a long time $t_S$ with a strongly reduced interference resistance or immunity. Moreover, the time $t_S$ falls in a period in which the address change takes place and therefore multiple switching operations occur in the memory module. Since the known read amplifier possesses no inherent or separate interference suppression, the interferences which are generated pass through to the data output and can prolong the read access time to more than double the value of the access time resulting without interference action.

SUMMARY OF THE INVENTION

An object underlying the invention is to design a read amplifier such that significant interference suppression is attainable. This object is solved by providing means associated with the read amplifier for feeding into the bit line with the higher read current an additional current generated by the read amplifier.

DESCRIPTION OF THE PREFERRED EMBODIMENTS

In order to facilitate an understanding of the invention, the operations occurring during reading of a memory cell and their effects on a read amplifier without interference suppression are first discussed.

Figure 1:
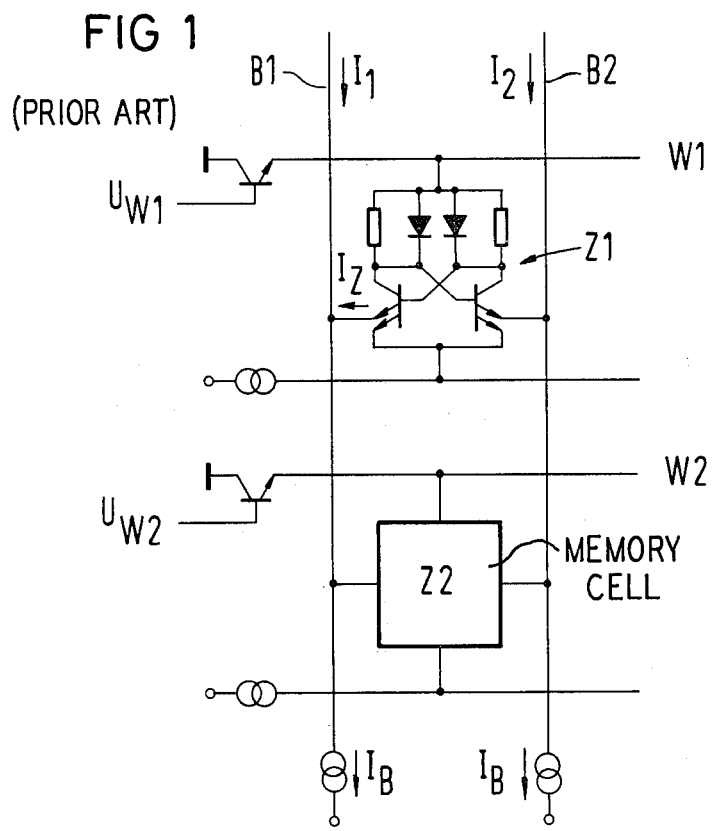
FIG. 1 illustrates a section of a memory matrix comprising two memory cells connected to common bit lines.

FIG. 1 illustrates two memory cells Z1 and Z2 which are connected in a known fashion with two bit lines B1 and B2, and which are selectable via the word lines W1 and W2. The word lines are activatable by the select signals $U_{W1}$ or $U_{W2}$. The currents $I_B$ from constant current sources are fed into the bit lines B1 and B2. In the illustration according to FIG. 1, it is assumed that the memory cell Z1 is selected. From the conductive transistor of this memory cell a current $I_Z$ then flows to the bit line B1. A corresponding current on the other side of the memory cell is lacking since the respective transistor is blocked. A read current $I_1$ results therefrom on the bit line B1, which read current $I_1$ is equal to the difference $I_B - I_Z$. Through suitable selection of the impressed current $I_B$ this difference is generally made at least approximately zero. The read current $I_2$ is equal to the impressed current $I_B$. In the case of a change of the activated word lines, i.e. in the case of a change of the selected memory cells, reloading or transfer operations commence which have an effect on the read currents $I_1$ and $I_2$. The effects naturally are dependent upon whether the data contained in the exchanged memory cells are the same or different.

Figure 2:
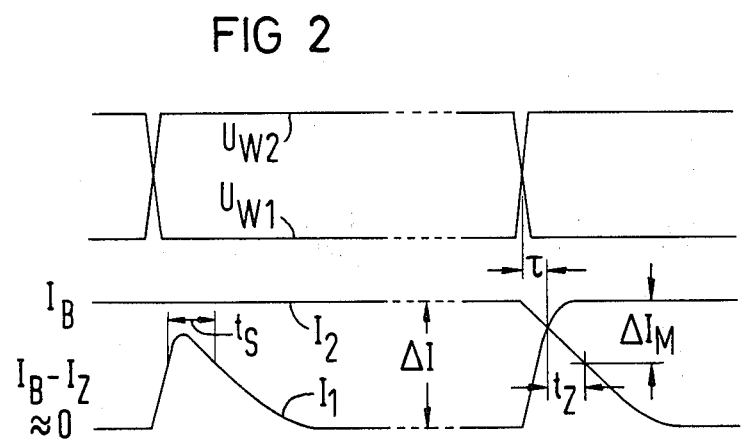
FIG. 2 illustrates a diagram of the progression of the read currents in the bit lines during a change of the word lines.

FIG. 2 illustrates in its upper portion the progression of the select signals $U_{W1}$ and $U_{W2}$. The respectively higher signal level signifies the selection of the associated word line W1 or W2, or of the memory cell Z1 or Z2.

In the lower portion of FIG. 2, the chronological progression of the read currents $I_1$ and $I_2$ is indicated. It is assumed here that during the first change of the select signals $U_{W1}$ and $U_{W2}$, the data present in the memory cells are the same. As is apparent from the diagram, the read current $I_2 = I_B$ does not change noticeably, whereas the read current $I_1$ deviates far from its quasi-stationary value and only slowly returns to this value. A time-span $t_S$ can be established in which the read current $I_1$ most closely approximates the read current $I_2$. In this time $t_S$ the interference resistance is strongly reduced, so that already relatively small interference or noise pulses can bring about a reversal in the polarity sign of the read current difference $\Delta I$. As already mentioned initially, precisely in this time multiple switching operations are sequentially running in the integrated circuit arrangement which are brought about by the address change which has just taken place.

In FIG. 2, for the second change of the selected memory cells Z1 and Z2 through repeated interchange of the select signals $U_{W1}$, $U_{W2}$, it is assumed that the two memory cells Z1 and Z2 have different information contents. Accordingly, also the read currents $I_1$ and $I_2$ change their values. The slow transition of the read current $I_2$ is striking. Essentially responsible for this is the recharging of the capacitance of the bit line B1 via the highly ohmic (e.g. 40 k$\Omega$) load impedance on the current-conducting side of the selected memory cell (here again Z1).

By contrast, the transition of the read current $I_1$ proceeds relatively rapidly, so that the time span $\tau$ (signal transit time) between the change of the select signals $U_{W1}$ and $U_{W2}$ and the time in which the difference $\Delta I$ of the read currents $I_1$ and $I_2$ becomes zero, remains short.

It is clear that the transition phase of the read current $I_1$ and $I_2$, in which the difference $\Delta I$ between the two currents becomes small or disappears, is again very susceptible to interference or noise pulses which are superimposed on the read current. It depends upon the properties of the read amplifiers to what extent the interferences become noticeable in the data output signal.

Figure 3:
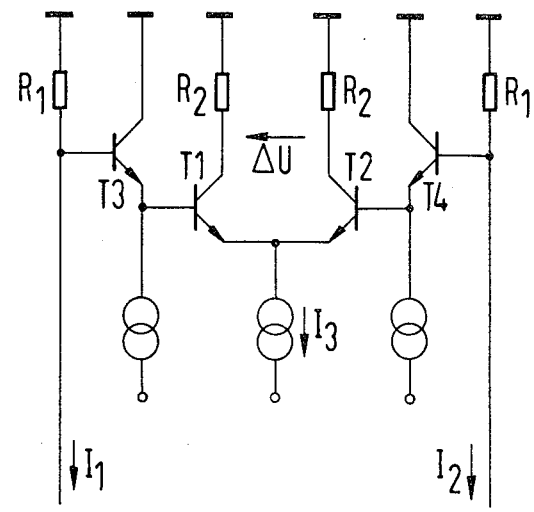
FIG. 3 illustrates a known read amplifier.

FIG. 3 illustrates a frequently employed read amplifier. It contains a differential amplifier with the emitter-coupled transistors T1 and T2. The differential amplifier is fed with a constant current $I_3$. Connected with the inputs of the differential amplifier are emitter follower transistors T3 and T4. They are controlled by the voltage drops in the read resistances $R_1$, such voltage drops being generated by the read currents $I_1$ and $I_2$, respectively. The difference $\Delta U$ between the collectors of the transistors T1 and T2 forms the output signal. The resistances $R_2$ are the respective collector resistances.

The known read amplifier according to FIG. 3 possesses a transmission characteristic which is provided by the following relation, ignoring the very small base currents of the transistors involved:

$$\Delta U = \left(1 - \frac{2}{1 + e^{\Delta I \cdot R_1/U_T}}\right) I_3 \cdot R_2$$

where $U_T = 26$ mV is the so-called temperature voltage.

Figure 5:
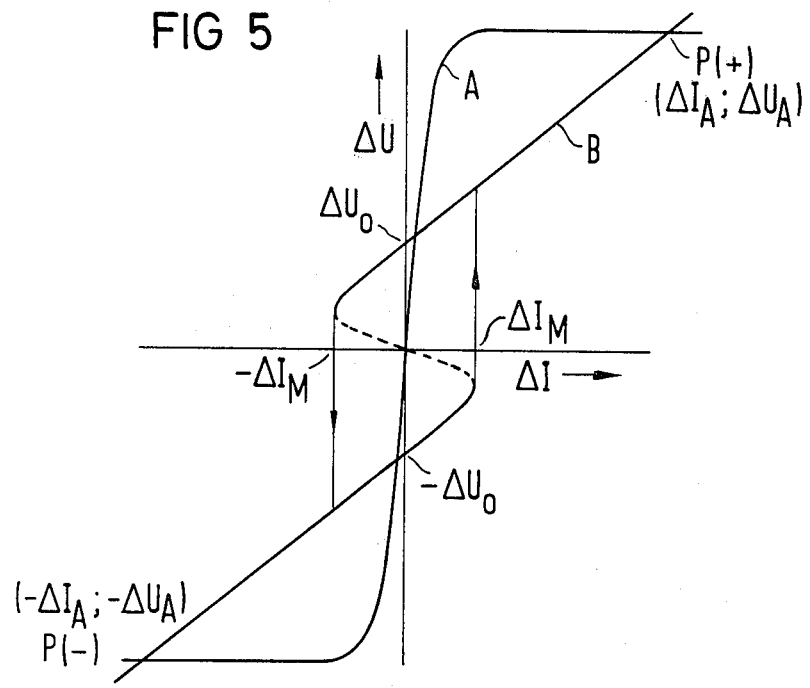
FIGS. 5 and 6 illustrate read amplifier transmission characteristics.

The basic progression of this transmission characteristic is illustrated in FIG. 5 by curve A. It illustrates a steep zero-axis crossing with a linear dependency of the output quantity $\Delta U$ upon $\Delta I$ and, for greater values of $\Delta I$, passes over into a positive or negative saturation region, respectively.

For $\Delta I = 0$ (i.e., $I_1 = I_2$) $\Delta U = 0$ occurs so that already very small interferences can effect changes of the data output signal. The inventive read amplifier according to FIG. 4 avoids this.

The new read amplifier again consists of a differential amplifier supplied with constant current $I_3$, and formed of emitter-coupled transistors T5 and T6. These transistors are activated via emitter followers with the transistors T7 and T8. In the read resistances terminating the bit lines, voltage drops proportional to the read currents $I_1$ and $I_2$ occur for the control of the read amplifier. These read resistances are now divided up into two partial resistances $R_3$ and $R_4$ each. The collectors of the transistors T5 and T6 are connected with the reciprocal connection points C1 and C2, respectively, of the partial resistances $R_3$ and $R_4$, namely in a crossover fashion. In this way, the collector of the transistor (e.g. T5) on the side of the read amplifier connected to the bit line B1 is connected to the connection point C2 of the partial resistances $R_3$ and $R_4$ on the bit line B2, and vice versa.

Figure 4:
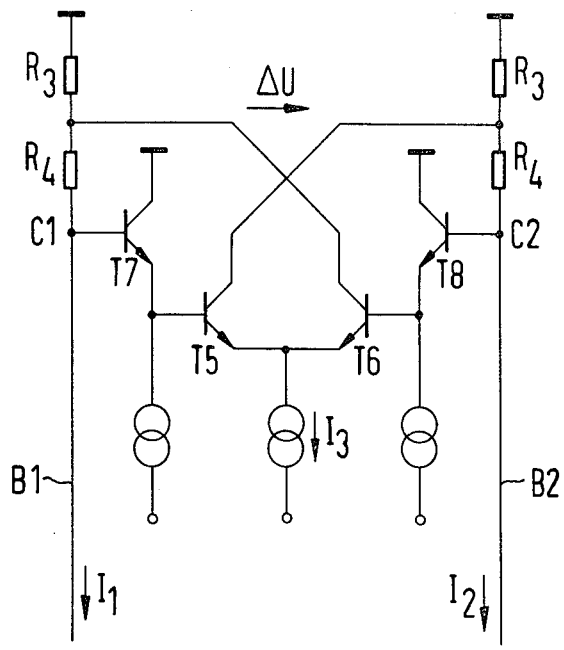
FIG. 4 illustrates a read amplifier in accordance with the invention.

For the read amplifier according to FIG. 4, a transmission characteristic results which is implicitly described by the relation $$\Delta U = \left\{ \Delta I + \left[1 - \frac{2}{1 + e^{(\Delta U + \Delta I \cdot R_4)/U_T}}\right] I_3 \right\} R_3 \quad (1)$$

For $\Delta I = 0$, three characteristic points result: a labile (unstable) point in the negative resistance region at $\Delta U =$ and two stablepoints at $\Delta U = \pm \Delta U_O$. $\Delta U_O$ is here implicitly determined by:

$$\Delta U_0 = \left(1 - \frac{2}{1 + e^{\Delta U_0/U_T}}\right) I_3 \cdot R_3 \quad (2)$$

The transmission characteristic is illustrated as curve B in FIG. 5. It is apparent that the turning or inversion points between the two positive resistance regions and the negative resistance region lie at a current difference which is designated in the following as $\Delta I_M$ and $-\Delta I_M$. An interference on the bit lines must thus at least attain the quantity $\Delta I_M$ if it is to effect an interference of the data output signal.

The critical value of the current difference $\Delta I_M$ is apparent from the preceding equations through implicit differentiation:

$$\Delta I_M = \frac{U_T}{R_3 + R_4} \left\{ \ln\left[n - 1 + \sqrt{n(n-2)}\right] - n\left[1 - \frac{2}{n + \sqrt{n(n-2)}}\right] \right\} \quad (3)$$

with $n = \frac{I_3 \cdot R_3}{U_T}$.

In order to adjust the optimum transmission characteristic, the resistances $R_3$ and $R_4$ and the current $I_3$, which is respectively fed in as additional current on the side of the greater read current, are available. Generally, a positive and negative operating point P (+) and P (−) is specified which are, for example, determined by $\Delta I_A = 1$ mA and $\Delta U_A = 0.6$ V, or which are determined by the corresponding negative values, respectively. In addition, for the input sweep current difference $\Delta I_M$, as well as for the voltage difference $\Delta U_O$ existing in the case of an input current difference $\Delta I = 0$, minimum demands are present with respect to the interference resistance.

Since the exponential term in the preceding equations becomes very large for small values of $\Delta U$ or $\Delta U_O$ respectively, the determination of the three decisive component values can be carried out, in all practical instances, with the aid of the following simplified equations:

$$\Delta U \approx (\Delta I + I_3) \cdot R_3,$$

$$\Delta U_O \approx I_3 \cdot R_3$$

and following herefrom:

$$R_3 = \frac{\Delta U_A - \Delta U_0}{\Delta I_A}$$

$$I_3 = \frac{\Delta I_A}{\Delta U_A/\Delta U_0 - 1}$$

The value for the resistance $R_4$, in the case of a given input sweep current difference $I_M$, can be obtained from equation (3).

Figure 6:
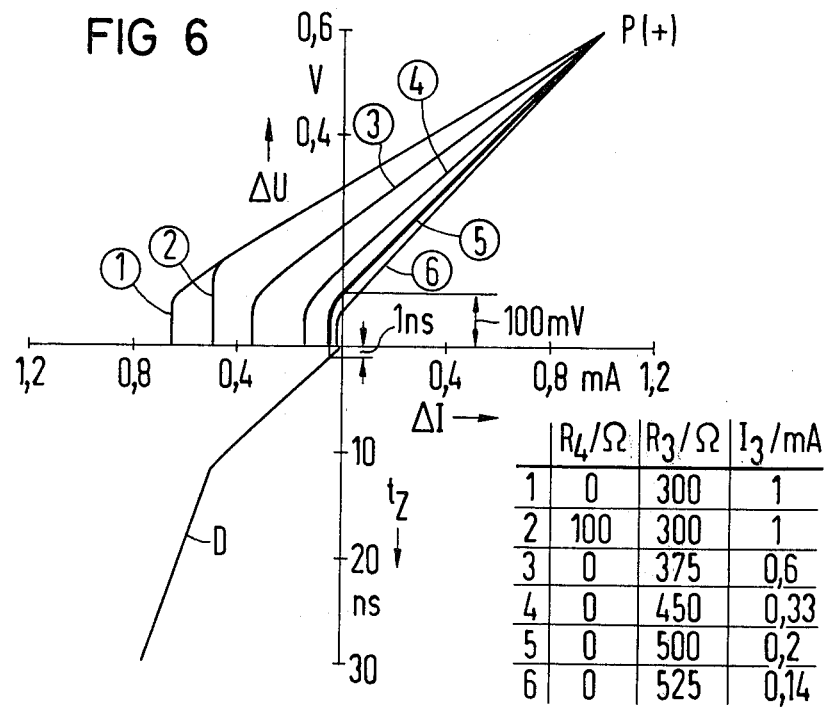

FIG. 6 illustrates transmission characteristics ① through ⑥ which result on the basis of different values for $R_3$, $R_4$ and $I_3$. FIG. 6 also contains a table from which the values for $R_3$, $R_4$ and $I_3$, which are the basis of the individual transmission characteristics, are apparent.

The preferred transmission characteristic ⑤ in FIG. 6 is emphasized by a greater line thickness. As can be read off from the graph $\Delta U_O = 100$ mV and $\Delta I_M = 0.04$ mA results for this transmission characteristic ⑤. The values for $R_3$, $R_4$ and $I_3$ can be determined from the Table contained in FIG. 6. It is apparent that in many instances, as well as in the case of the preferred characteristic ⑤, the value for the resistance $R_4$ becomes zero.

In FIG. 6, yet an additional curve D is illustrated which shows the dependency of an additional switching time $t_Z$ upon the sweep current difference $\Delta I_M$. If the read amplifier during transition from one to the other information does not already switch at an input current difference $\Delta I=0$, but only subsequent to the attainment of the sweep current difference $\Delta I_M$, then it requires beyond the basic transit time $\tau$ the additional switching time $t_Z$ (cf. FIG. 2). In addition to the sweep current difference, this time primarily is dependent upon the edge steepness of the read current. Underlying the curve D in FIG. 6 is a rise time of 35 ns and a fall time of 70 ns. In the case of memory cells of the type illustrated in FIG. 1, these values can presently be considered as average values.

Although various minor modifications may be suggested by those versed in the art, it should be understood that I wish to embody within the scope of the patent warranted herein, all such embodiments as reasonably and properly come within the scope of my contribution to the art.

I claim as my invention:

1. A read amplifier for a bipolar memory module having memory cells arranged in matrix-fashion, the read amplifier evaluating a difference of higher and lower respective read currents in a first and a second bit line of the memory module, comprising: means in said read amplifier for feeding into the bit line with the higher read current an additional current generated by the read amplifier.

2. A read amplifier for a bipolar memory module having memory cells arranged in matrix-fashion, the read amplifier evaluating a difference of higher and lower respective read currents in a first and a second bit line of the memory module, comprising: means in said read amplifier for feeding into the bit line with the higher read current an additional current generated by the read amplifier; said read amplifier having means for evaluating a difference of voltage drops caused by read currents at read resistances terminating the first and second bit line, said means for evaluating comprising a differential amplifier formed of emitter-coupled transistors connected to operate with a constant current, inputs of the differential amplifier being connected via emitter followers to the bit lines; and each of the read resistances being divided up into two partial resistances, and a collector of the transistor controlled by and associated with one bit line of the differential amplifier being connected with a connection point between the partial resistances of the other bit line, and vice versa.

3. A read amplifier according to claim 2 wherein one of the partial resistances is disposed between the collector of the respective transistor of the differential amplifier and a control input of the respective emitter follower, said one partial resistance being substantially smaller than the respective other partial resistance.

4. A read amplifier according to claim 3 wherein each of said one partial resistances between the collectors of the respective transistors and the control inputs of the respective emitter followers have substantially no resistance.

5. A memory module system comprising: a bipolar memory module having a plurality of memory cells arranged in matrix-fashion and with first and second bit lines associated with the memory cells, higher and lower respective read currents occurring in the first and second bit lines during operation of the module; a read amplifier means connected to the first and second bit lines for the purpose of evaluating a difference of the higher and lower respective read currents in the first and second bit lines during operation; and means associated with the read amplifier means for feeding into the bit line with the higher read current an additional read current generated by the read amplifier means.

6. A memory module system, comprising: a bipolar memory module having a plurality of memory cells arranged in matrix-fashion and with first and second bit lines associated with the memory cells, higher and lower respective read currents occurring in the first and second bit lines during operation of the module; a read amplifier means connected to the first and second bit lines for the purpose of evaluating a difference of the higher and lower respective read currents in the first and second bit lines during operation; means associated with the read amplifier means for feeding into the bit line with the higher read current an additional read current generated by the read amplifier means; the read amplifier means comprising a differential amplifier having two transistors forming two inputs and having an emitter follower connected to each input; the bit lines connecting to inputs of the respective emitter followers; a read resistance connected between the input of the respective emitter follower and a reference potential; and a collector of one of the transistors of the differential amplifier associated with one bit line connecting to the partial resistance in the other bit line between the partial resistance and the associated emitter follower, and vice-versa for a collector of the other transistor of the differential amplifier.

* * * * *